(12) United States Patent
Sakurai et al.

(10) Patent No.: US 12,007,692 B2
(45) Date of Patent: Jun. 11, 2024

(54) NOZZLE, SUBSTRATE PROCESSING APPARATUS, AND SUBSTRATE PROCESSING METHOD

(71) Applicant: Tokyo Electron Limited, Tokyo (JP)

(72) Inventors: Hiroki Sakurai, Koshi (JP); Nobuhiro Ogata, Koshi (JP); Daisuke Goto, Koshi (JP); Kanta Mori, Koshi (JP); Kenji Yada, Koshi (JP); Yusuke Hashimoto, Koshi (JP); Shoki Mizuguchi, Koshi (JP); Yenrui Hsu, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 18/077,577

(22) Filed: Dec. 8, 2022

(65) Prior Publication Data

US 2023/0185199 A1 Jun. 15, 2023

(30) Foreign Application Priority Data

Dec. 14, 2021 (JP) .................................. 2021-202225

(51) Int. Cl.
*G03F 7/30* (2006.01)
*G03F 7/42* (2006.01)

(52) U.S. Cl.
CPC ............ *G03F 7/3021* (2013.01); *G03F 7/426* (2013.01)

(58) Field of Classification Search
None
See application file for complete search history.

(56) References Cited

U.S. PATENT DOCUMENTS

| 2008/0008834 A1* | 1/2008 | Collins | H01L 21/67051 |
| | | | 118/301 |
| 2008/0283090 A1* | 11/2008 | DeKraker | H01L 21/31133 |
| | | | 134/28 |
| 2011/0247661 A1* | 10/2011 | Hayashida | G03F 7/42 |
| | | | 134/198 |
| 2018/0277401 A1* | 9/2018 | Watanabe | H01L 22/20 |

FOREIGN PATENT DOCUMENTS

JP 2014-027245 A 2/2014

* cited by examiner

*Primary Examiner* — Cristi J Tate-Sims
(74) *Attorney, Agent, or Firm* — Nath, Goldberg & Meyer; Jerald L. Meyer; Tanya E. Harkins

(57) ABSTRACT

A nozzle that mixes fluid containing steam or mist of pressurized pure water and processing liquid containing at least sulfuric acid and ejects mixed fluid of the fluid and the processing liquid, the nozzle comprising: at least one first ejection port ejecting the fluid; at least one second ejection port ejecting the processing liquid; and at least one lead-out path being in fluid communication with the at least one first ejection port and the at least one second ejection port and leading out the mixed fluid of the fluid ejected from the at least one first ejection port and the processing liquid ejected from the at least one second ejection port, wherein the at least one first ejection port or the at least one second ejection port is arranged to be directed to position deviated from central axis of the at least one lead-out path in a plan view.

15 Claims, 13 Drawing Sheets

NOZZLE, SUBSTRATE PROCESSING APPARATUS, AND SUBSTRATE PROCESSING METHOD

CROSS-REFERENCE TO RELATED APPLICATION

This application is based upon and claims the benefit of priority from Japanese Patent Application No. 2021-202225, filed on Dec. 14, 2021, the entire contents of which are incorporated herein by reference.

TECHNICAL FIELD

The present disclosure relates to a nozzle, a substrate processing apparatus, and a substrate processing method.

BACKGROUND

In a semiconductor device manufacturing process, there is known a technique of removing an object to be removed such as a resist film from a substrate such as a semiconductor wafer by supplying a processing liquid to the substrate.

PRIOR ART DOCUMENTS

Patent Documents

Patent Document 1: Japanese Laid-Open Publication No. 2014-027245

SUMMARY

According to an embodiment of the present disclosure, there is provided a nozzle that mixes a fluid containing steam or mist of pressurized pure water and a processing liquid containing at least sulfuric acid and ejects a mixed fluid of the fluid and the processing liquid. The nozzle includes at least one first ejection port, at least one second ejection port, and at least one lead-out path. The at least one first ejection port is configured to eject the fluid. The at least one second ejection port is configured to eject the processing liquid. The at least one lead-out path is configured to be in fluid communication with the at least one first ejection port and the at least one second ejection port and lead out the mixed fluid of the fluid ejected from the at least one first ejection port and the processing liquid ejected from the at least one second ejection port. Further, the at least one first ejection port or the at least one second ejection port is arranged to be directed to a position deviated from a central axis of the at least one lead-out path in a plan view.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
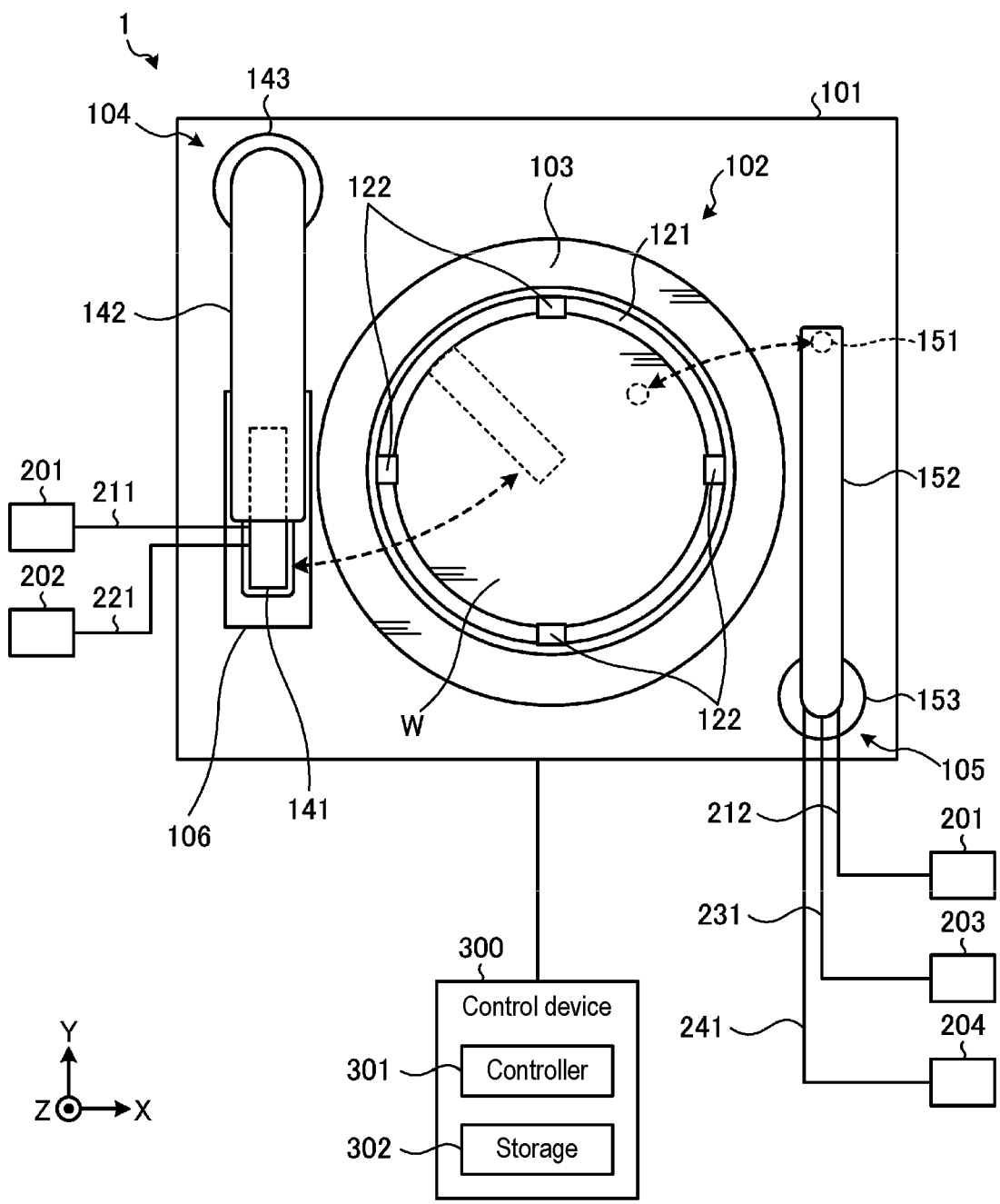
FIG. 1 is a schematic plan view of a substrate processing apparatus according to a first embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, modes (hereinafter, referred to as "embodiments") of implementing a nozzle, a substrate processing apparatus, and a substrate processing method according to the present disclosure will be described in detail with reference to the accompanying drawings. The present disclosure is not limited by these embodiments. It is possible to appropriately combine respective embodiments, as long as the processing contents thereof are not inconsistent. In each of the following embodiments, the same components will be denoted by the same reference numerals, and redundant descriptions will be omitted.

In the embodiments described below, expressions such as "constant", "orthogonal", "vertical", or "parallel" may be used, but these expressions may not be strictly "constant", "orthogonal", "vertical", or "parallel." That is, each of the above-mentioned expressions allows for a deviation in, for example, manufacturing accuracy, installation accuracy, or the like.

In each of the drawings to be referred to below, for the sake of easy understanding of the description, an orthogonal coordinate system may be defined in which the X-axis direction, the Y-axis direction, and the Z-axis direction are orthogonal to one another and the Z-axis positive direction is a vertical upward direction. Further, a direction of rotation about the vertical axis may be called a θ direction.

In a semiconductor device manufacturing process, a resist film is formed in a predetermined pattern on a film to be processed formed on a substrate such as a semiconductor wafer. By using this resist film as a mask, a process such as etching or ion implementation is performed on the film to be processed. After the process, a redundant resist film is removed from the wafer.

An SPM process is used as a method of removing the resist film. The SPM process is performed by supplying a high-temperature sulfuric acid hydrogen peroxide mixture (SPM) liquid obtained by mixing sulfuric acid and hydrogen peroxide solution to the resist film. In this SPM process, use of a mixed fluid of steam of pressurized pure water (deionized water) (hereinafter referred to as "vapor") and the SPM liquid has been examined.

In the embodiments of the present disclosure described below, a substrate processing apparatus capable of efficiently mixing the vapor and the SPM liquid in the SPM process using the mixed fluid of the vapor and the SPM liquid will be described.

Further, the substrate processing apparatus according to the present disclosure is also applicable to a liquid process other than an SPM process. Specifically, the substrate processing apparatus according to the present disclosure is applicable to a liquid process in which a processing liquid containing at least sulfuric acid is used.

The "processing liquid containing at least sulfuric acid" other than the SPM liquid includes, for example, a processing liquid that reacts (heats up or increases etchant) when mixed with sulfuric acid, specifically dilute sulfuric acid (a mixed liquid of sulfuric acid and water), a mixed liquid of sulfuric acid and ozone water, or the like. In addition, the "processing liquid containing at least sulfuric acid" may be sulfuric acid.

First Embodiment

<Structure of Substrate Processing Apparatus>

Figure 2:
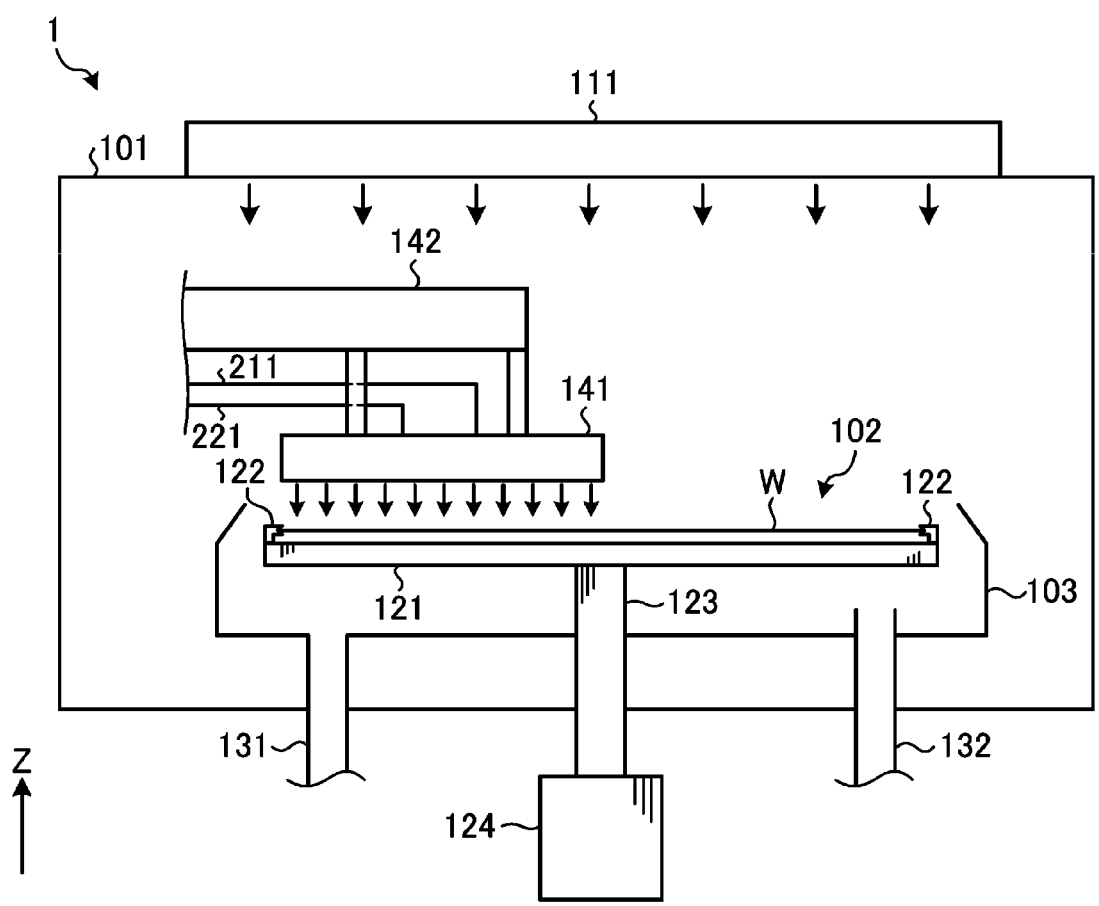
FIG. 2 is a schematic side view of the substrate processing apparatus according to the first embodiment.

First, a structure of a substrate processing apparatus according to a first embodiment of the present disclosure will be described with reference to FIGS. 1 and 2. FIG. 1 is a schematic plan view of the substrate processing apparatus according to the first embodiment. FIG. 2 is a schematic side view of the substrate processing apparatus according to the first embodiment. A second supply mechanism 105 and a nozzle cleaning mechanism 106 are not illustrated in FIG. 2.

As illustrated in FIGS. 1 and 2, the substrate processing apparatus 1 includes a chamber 101, a substrate holder 102, a cup 103, a first supply mechanism 104, a second supply mechanism 105, and a nozzle cleaning mechanism 106. The substrate processing apparatus 1 also includes a vapor supplier 201, an SPM supplier 202, a rinsing liquid supplier 203, and a substitution liquid supplier 204. The substrate processing apparatus 1 removes a resist film formed on the front surface of a substrate such as a semiconductor wafer (hereinafter, referred to as "wafer W").

Conventionally, an SPM process is known as a resist film removing method. The SPM process is performed by supplying a high-temperature sulfuric acid hydrogen peroxide mixture (SPM) liquid obtained by mixing sulfuric acid and hydrogen peroxide solution to a resist film.

It is possible to improve resist film removal efficiency by raising the temperature of the SPM liquid. As a method of raising the temperature of the SPM liquid, for example, the temperature of sulfuric acid may be raised. However, heat resistance and pressure resistance of a pipe through which the sulfuric acid flows need to be improved to raise the temperature of the sulfuric acid, which imposes a heavy load on hardware. Further, a mixing ratio of sulfuric acid and hydrogen peroxide solution may be changed to increase a proportion of hydrogen peroxide solution. However, when the proportion of the hydrogen peroxide solution is increased, fume or bumping is likely to occur. Further, the SPM liquid on a wafer W may be heated with an infrared heater or the like, but there is a challenge in terms of, for example, temperature stability.

Therefore, in the substrate processing apparatus 1, steam of pressurized pure water (deionized water) (hereinafter referred to as "vapor") is mixed with an SPM liquid. Thus, it possible to preferably raise the temperature of the SPM liquid.

The chamber 101 accommodates the substrate holder 102, the cup 103, the first supply mechanism 104, and the second supply mechanism 105. A fun filter unit (FFU) 111 configured to form a down flow inside the chamber 101 is provided at a ceiling of the chamber 101 (see FIG. 2).

The substrate holder 102 includes a main body 121 with a diameter larger than that of a wafer W, grippers 122 formed on a top surface of the main body 121, a support member 123 configured to support the main body 121, and a driver 124 configured to rotate the support member 123. The number of grippers 122 is not limited to that illustrated in the figure.

The substrate holder 102 holds a wafer W by gripping a peripheral edge of the wafer W by using grippers 122. As a result, the wafer W is held horizontally in the state of being slightly separated from the top surface of the main body 121. As described above, a resist film is formed on the front surface (top surface) of the wafer W.

Here, the substrate holder 102 configured to hold the peripheral edge of the wafer W by using the grippers 122 is taken as an example, but the substrate processing apparatus 1 may be configured to include a vacuum chuck configured to suction and hold a rear surface of the wafer W, instead of the substrate holder 102.

The cup 103 is disposed to surround the substrate holder 102. A liquid discharge port 131 configured to discharge a processing liquid supplied to the wafer W to the exterior of the chamber 101 and a gas discharge port 132 configured to discharge the atmosphere in the chamber 101 are formed at the bottom of the cup 103.

The first supply mechanism 104 includes a nozzle 141, a first arm 142 extending horizontally and configured to support the nozzle 141 from above, and a first pivot/lift mechanism 143 configured to pivot and lift the first arm 142. The first arm 142 may move the nozzle 141 between a processing position above the wafer W and a standby position outside the wafer W by the first pivot/lift mechanism 143.

The nozzle 141 is a bar nozzle extending linearly along the horizontal direction. The nozzle 141 has a length substantially equal to a radius of the wafer W. In the state of being disposed at the processing position, a longitudinal tip of the nozzle 141 is disposed above a center of the wafer W, and a longitudinal base of the nozzle 141 is disposed above the peripheral edge of the wafer W.

The nozzle 141 is connected to the vapor supplier 201 via a vapor supply path 211. Further, the nozzle 141 is connected to the SPM supplier 202 via an SPM supply path 221. The vapor supplier 201 supplies vapor, which is steam of pressurized pure water (deionized water), to the nozzle 141 via the vapor supply path 211. The SPM supplier 202 supplies the SPM liquid, which is a mixed liquid of sulfuric acid and hydrogen peroxide solution, to the nozzle 141 via the SPM supply path 221. Any known technology may be used to constitute the vapor supplier 201 and the SPM supplier 202. For example, the SPM supplier 202 includes a sulfuric acid source configured to supply sulfuric acid, a hydrogen peroxide solution source configured to supply hydrogen peroxide solution, and a mixer configured to mix the sulfuric acid and the hydrogen peroxide solution.

The nozzle 141 mixes the vapor supplied from the vapor supplier 201 with the SPM liquid supplied from the SPM supplier 202, and ejects a mixed liquid of the vapor and the SPM liquid to the wafer W. A specific structure of the nozzle 141 is described below.

The second supply mechanism 105 includes an auxiliary nozzle 151, a second arm 152 extending horizontally and configured to support the auxiliary nozzle 151 from above, and a second pivot/lift mechanism 153 configured to pivot and lift the second arm 152. The second arm 152 may move the auxiliary nozzle 151 between the processing position above the wafer W and the standby position outside the wafer W by the second pivot/lift mechanism 153.

The auxiliary nozzle 151 is connected to the vapor supplier 201 via the vapor supply path 212. The vapor supplier 201 supplies vapor to the auxiliary nozzle 151 via the vapor supply path 212. Further, the auxiliary nozzle 151 is connected to the rinsing liquid supplier 203 via a rinsing liquid supply path 231 and connected to the substitution liquid supplier 204 via a substitution liquid supply path 241. The rinsing liquid supplier 203 supplies a rinsing liquid (here, for example, pure water (deionized water)) to the auxiliary nozzle 151 via the rinsing liquid supply path 231. The substitution liquid supplier 204 supplies a substitution liquid (here, for example, isopropyl alcohol (IPA)) to the auxiliary nozzle 151 via the substitution liquid supply path 241. Any known technology may be used to constitute the rinsing liquid supplier 203 and the substitution liquid supplier 204.

The auxiliary nozzle 151 ejects, to the wafer W, the vapor supplied from the vapor supplier 201 via the vapor supply path 212. Further, the auxiliary nozzle 151 ejects, to the wafer W, the rinsing liquid supplied from the rinsing liquid supplier 203 via the rinsing liquid supply path 231. Further, the auxiliary nozzle 151 ejects, to the wafer W, the substitution liquid supplied from the substitution liquid supplier 204 via the substitution liquid supply path 241.

The nozzle cleaning mechanism 106 is disposed at the standby position of the nozzle 141. The nozzle cleaning mechanism 106 cleans the nozzle 141.

The substrate processing apparatus 1 includes a control device 300. The control device 300 is, for example, a computer, and includes a controller 301 and a storage 302. The storage 302 stores programs that controls various processes executed in the substrate processing apparatus 1. The controller 301 controls an operation of the substrate processing apparatus 1 by reading and executing the programs stored in the storage 302.

Further, such programs may be stored in a computer-readable storage medium, and may be installed in the storage 302 of the control device 300 from the storage medium. The computer-readable storage medium is, for example, a hard disk (HD), a flexible disk (FD), a compact disk (CD), a magneto-optical disk (MO), a memory card, or the like.

<Structure of Nozzle>

Figure 3:
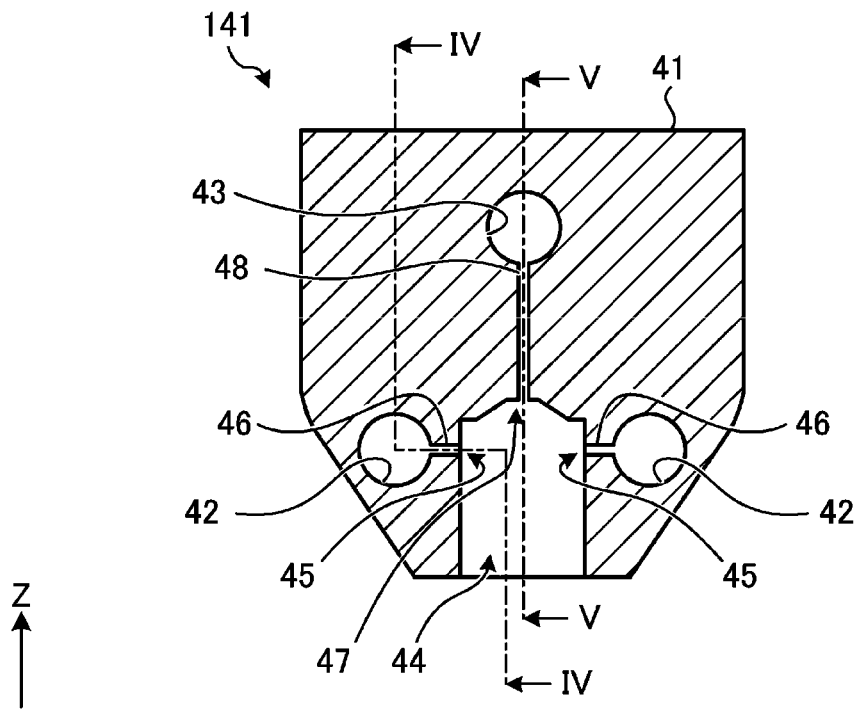
FIG. 3 is a cross-sectional view of a nozzle according to the first embodiment taken along a plane orthogonal to a longitudinal direction of the nozzle.
Figure 4:
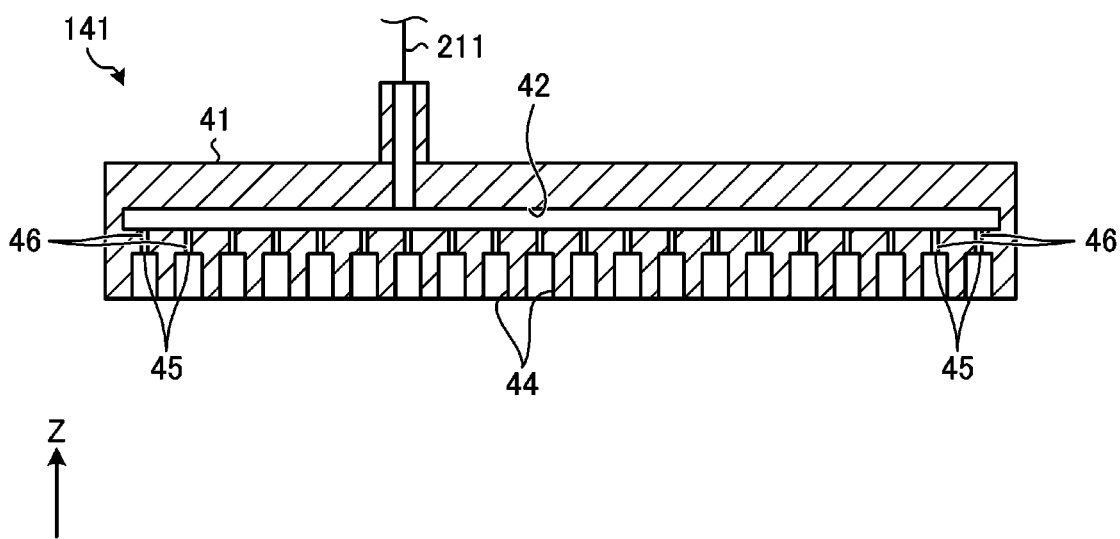
FIG. 4 is a cross-sectional view taken along line IV-IV indicated in FIG. 3.
Figure 5:
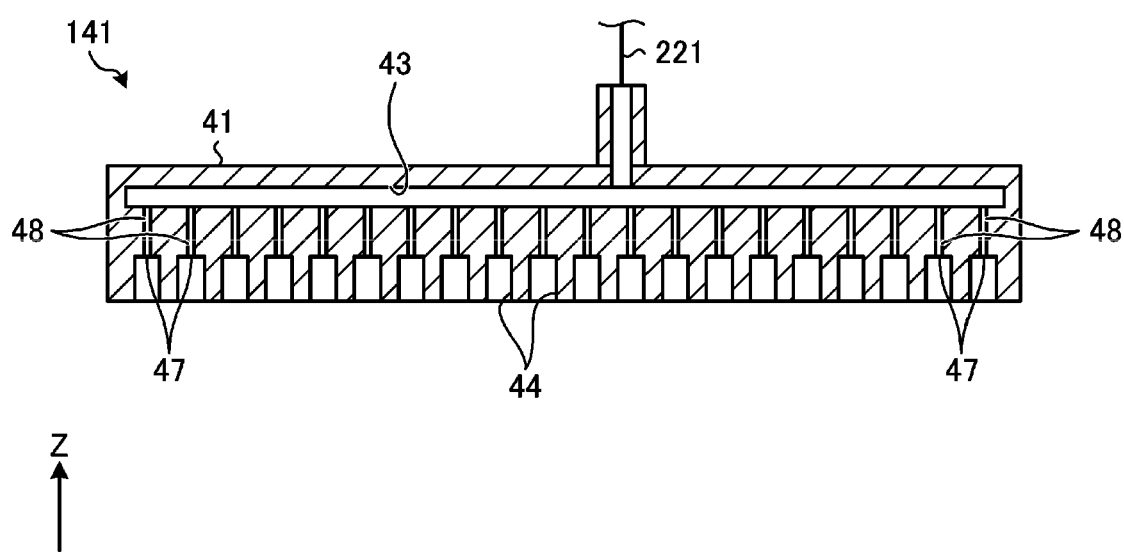
FIG. 5 is a cross-sectional view taken along line V-V indicated in FIG. 3.
Figure 6:
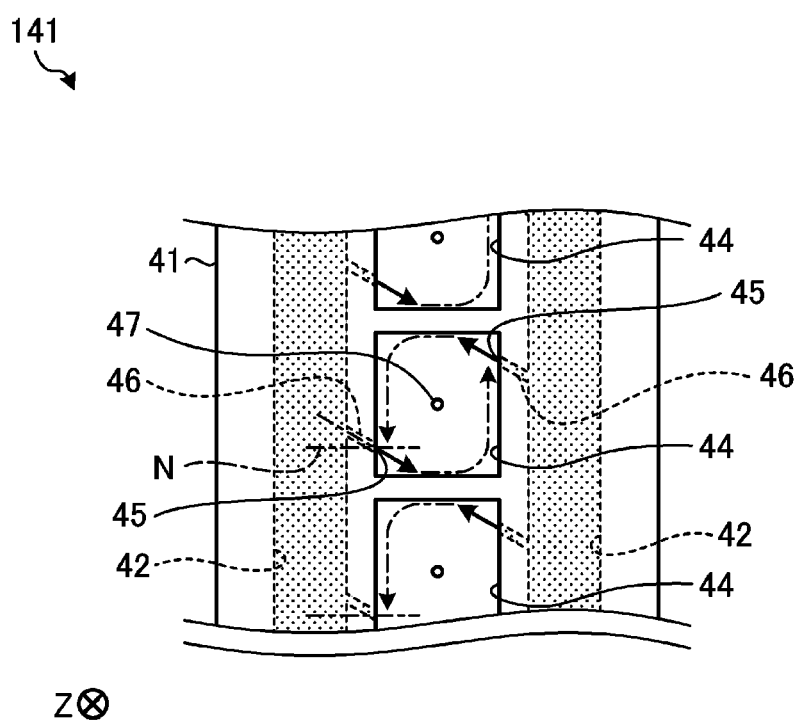
FIG. 6 is a schematic plan view of the nozzle according to the first embodiment when viewed from below.

Next, a structure of the nozzle 141 will be described with reference to FIGS. 3 to 6. FIG. 3 is a cross-sectional view of the nozzle 141 according to the first embodiment of the present disclosure taken along a plane orthogonal to the longitudinal direction of the nozzle. FIG. 4 is a cross-sectional view taken along line IV-IV indicated in FIG. 3. FIG. 5 is a cross-sectional view taken along line V-V indicated in FIG. 3. FIG. 6 is a schematic plan view of the nozzle 141 according to the first embodiment when viewed from below. Further, in FIG. 6, an area through which the vapor flows is indicated by dots.

As illustrated in FIG. 3, the nozzle 141 includes a nozzle main body 41, two first distribution paths 42, one second distribution path 43, and lead-out paths 44 (see FIGS. 4 and 5). Further, the nozzle 141 includes first ejection ports 45 and first ejection paths 46 (see FIG. 4), and second ejection ports 47 and second ejection paths 48 (see FIG. 5).

The first distribution paths 42 and the second distribution path 43 are formed inside the nozzle main body 41. As illustrated in FIGS. 4 and 5, the first distribution paths 42 and the second distribution path 43 extend along the longitudinal direction of the nozzle main body 41. The first distribution paths 42 are connected to the vapor supplier 201 via the vapor supply path 211. Further, the second distribution path 43 is connected to the SPM supplier 202 via the SPM supply path 221.

As illustrated in FIG. 3, the second distribution path 43 is arranged on a median line (a line that bisects the nozzle main body 41 to the left and right) in a cross-sectional view of the nozzle main body 41. Further, the two first distribution paths 42 are arranged one by one on the left and right sides of the median line of the nozzle main body 41 when viewed in cross section.

The lead-out paths 44 are located below the second distribution path 43. As illustrated in FIGS. 3 to 5, the lead-out paths 44 are flow paths formed at a lower portion of the nozzle main body 41 and extend vertically downward. The lead-out paths 44 are arranged along the longitudinal direction of the nozzle main body 41. Adjacent lead-out paths 44 are separated by a partition wall. The cross-sectional shape of the lead-out paths 44 is, for example, rectangular. Further, the cross-sectional shape of the lead-out paths 44 may be circular, elliptical, or the like.

The first ejection ports 45 are open at the inner surfaces of the lead-out paths 44. Further, the second ejection ports 47 are arranged above the first ejection ports 45 and are open at the upper end surfaces of the lead-out paths 44. As illustrated in FIGS. 4 and 5, the first ejection ports 45 and the second ejection ports 47 are arranged along the longitudinal direction of the nozzle main body 41.

As illustrated in FIGS. 3 to 6, the nozzle 141 includes first ejection ports 45 and second ejection ports 47, and includes lead-out paths 44, each of which is in fluid communication with two first ejection ports 45 and one second ejection port 47. Further, the numbers of first ejection ports 45 and second ejection ports 47 being in fluid communication with one lead-out path 44 are not limited to the numbers illustrated in FIGS. 3 to 6. That is, the nozzle 141 may include lead-out paths 44, each of which is in fluid communication with at least one first ejection port 45 and at least one second ejection port 47.

The first ejection ports 45 are connected to the first distribution paths 42 via the first ejection paths 46. Further, the second ejection ports 47 are connected to the second distribution path 43 via the second ejection paths 48.

The vapor supplied from the vapor supplier 201 to the first distribution paths 42 is distributed from the first distribution paths 42 to the first ejection paths 46, and is ejected from the first ejection ports 45 to the corresponding lead-out paths 44 respectively. Further, the SPM liquid supplied from the SPM supplier 202 to the second distribution path 43 is distributed from the second distribution path 43 to the second ejection paths 48, and is ejected from the second ejection ports 47 to the corresponding lead-out paths 44 respectively.

The vapor ejected from the first ejection ports 45 and the SPM liquid ejected from the second ejection ports 47 are mixed near the upper ends, which are inlets of the lead-out paths 44, and are ejected toward the wafer W from the lower ends, which are outlets of the lead-out paths 44.

When the nozzle 141 does not include the lead-out paths 44, droplets of the SPM liquid ejected from the nozzle 141 may be diffused, and thus the SPM liquid and the vapor may not be properly mixed. Further, the diffused SPM liquid may adhere to the inner wall of the chamber 101 and contaminate the chamber 101 and the wafer W within the chamber 101.

In connection with this, the nozzle 141 according to the first embodiment include the lead-out paths 44, whereby it is possible to suppress the vapor ejected from the first ejection ports 45 and the SPM liquid ejected from the second ejection ports 47 from being diffused without coming into contact with each other. Thus, the nozzle 141 may appropriately mix the vapor and the SPM liquid in the lead-out paths 44. Therefore, with the nozzle 141 according to the embodiment, it is possible to raise the temperature of the SPM liquid to a higher temperature than that obtained with, for example, a nozzle that does not include the lead-out paths 44. It is also possible to suppress contamination within the chamber 101 due to diffusion of the SPM liquid.

Further, as illustrated in FIG. 6, the second ejection ports 47 are arranged coaxially with the lead-out paths 44 in a plan view. The second ejection ports 47 eject the SPM liquid in the direction along the center axes of the lead-out paths 44 (that is, the Z-axis direction). Further, the first ejection ports 45 are arranged to be directed to positions deviated from the central axes of the lead-out paths 44 in a plan view. The first ejection ports 45 eject vapor toward the positions deviated from the central axes of the lead-out paths 44 in a plan view. As a result, the vapor that has collided with the inner surfaces of the lead-out paths 44 is mixed with the SPM liquid ejected from the second ejection ports 47 while forming swirling flows of vapor inside the lead-out paths 44. The vapor ejected from the first ejection ports 45 may flow along the inner surfaces of the lead-out paths 44 to form swirling flows of vapor in the lead-out paths 44.

When the first ejection ports 45 are arranged to be directed to the positions of the central axes of the lead-out paths 44 in a plan view, the vapor ejected from the first ejection ports 45 collides with the inner surfaces of the lead-out paths 44 and is diffused. Thus, swirling flows of vapor are unlikely to be formed in the lead-out paths 44.

In contrast, in the nozzle 141 according to the first embodiment, by arranging the first ejection ports 45 to be directed to the positions deviated from the central axes of the lead-out paths 44 in a plan view, it is possible to cause the vapor ejected from the first ejection ports 45 to flow along the inner surfaces of the lead-out paths 44. Thus, the nozzle 141 may easily form swirling flows of vapor in the lead-out paths 44. Therefore, with the nozzle 141 according to the first embodiment, it is possible to efficiently mix the vapor and the SPM liquid compared to the case where the first ejection ports 45 are arranged to be directed to the positions of the central axes of the lead-out paths 44. In addition, by efficiently mixing the vapor and the SPM liquid, it is possible to efficiently raise the temperature of the SPM liquid.

Further, the central axes of the first ejection ports 45 are tilted with respect to a direction of normal lines N of the inner surfaces of the lead-out paths 44 in a plan view. By tilting the central axes of the first ejection ports 45 with respect to the directions of the normal lines N, it is possible to facilitate the formation of swirling flows of vapor in the lead-out paths 44 compared to the case where the central axes of the first ejection ports 45 are perpendicular to the inner surfaces of the lead-out paths 44. Further, since the swirling flows may extend a staying time of the vapor in the lead-out paths 44, it is possible to suppress an amount of vapor used when mixing the vapor and the SPM liquid.

<Specific Operation of Substrate Processing Apparatus>

Figure 7:
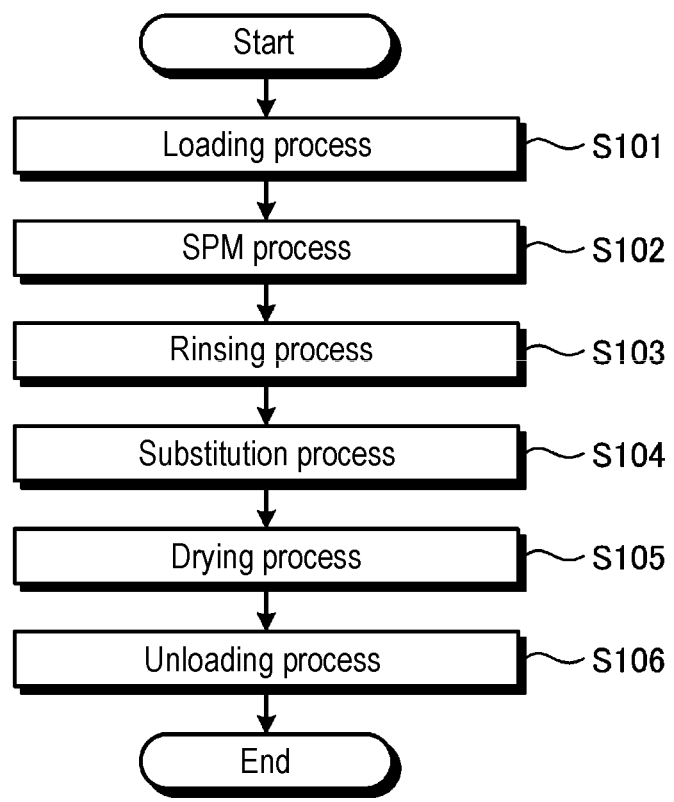
FIG. 7 is a flowchart illustrating a procedure of processes executed by the substrate processing apparatus according to the first embodiment.

Next, specific operations of the substrate processing apparatus 1 will be described with reference to FIG. 7. FIG. 7 is a flowchart illustrating a procedure of processes executed by the substrate processing apparatus 1 according to the first embodiment of the present disclosure. A series of processes illustrated in FIG. 7 are executed according to the control by the controller 301.

First, in the substrate processing apparatus 1, a wafer W loading process is performed (step S101). Specifically, a wafer W is loaded into the chamber 101 (see FIG. 1) of the substrate processing apparatus 1 by a substrate transport apparatus disposed outside the substrate processing apparatus 1 and held by the substrate holder 102. Thereafter, the substrate processing apparatus 1 rotates the substrate holder 102 at a predetermined rotation speed.

Subsequently, an SPM process is performed in the substrate processing apparatus 1 (step S102). First, the first pivot/lift mechanism 143 moves the nozzle 141 from the standby position to the processing position on the wafer W. Thereafter, a mixed fluid of vapor and an SPM liquid is ejected from the nozzle 141 to the front surface of the wafer W. As a result, the resist film formed on the front surface of the wafer W is removed.

In the substrate processing apparatus 1, the auxiliary nozzle 151 may be used in the SPM process. When the auxiliary nozzle 151 is used, the second pivot/lift mechanism 153 positions the auxiliary nozzle 151 above the wafer W. Specifically, the auxiliary nozzle 151 is disposed at a position where the supply of vapor may be insufficient with the nozzle 141 alone, for example, at the outer peripheral portion of the wafer W. Thereafter, vapor is ejected to the surface of the wafer W from the auxiliary nozzle 151.

By using the auxiliary nozzle 151 in this way, it is possible to supply the vapor to the entire front surface of the wafer W more evenly. Therefore, it is possible to raise the temperature of the SPM liquid more evenly over the entire surface of the wafer W.

After finishing the SPM process in step S102, the substrate processing apparatus 1 performs a rinsing process (step S103). In such a rinsing process, a rinsing liquid (pure water) is supplied to the front surface of the wafer W from the auxiliary nozzle 151. The rinsing liquid supplied to the wafer W is applied to and spread over the front surface of the wafer W due to the centrifugal force accompanying the rotation of the wafer W. As a result, the SPM liquid remaining on the wafer W is washed away by the rinsing liquid.

Subsequently, a substitution process is performed in the substrate processing apparatus 1 (step S104). In the substitution process, a substitution liquid (IPA) is supplied to the front surface of wafer W from the auxiliary nozzle 151. The substitution liquid supplied to the wafer W is applied to and spread over the front surface of the wafer W due to the centrifugal force accompanying the rotation of the wafer W. As a result, the rinsing liquid remaining on the wafer W is substituted with the substitution liquid.

Subsequently, a drying process is performed in the substrate processing apparatus 1 (step S105). In such a drying process, the number of rotations of the wafer W is increased. As a result, the substitution liquid remaining on the wafer W is shaken off, and the wafer W is dried. Thereafter, the rotation of the wafer W is stopped.

Subsequently, in the substrate processing apparatus 1, an unloading process is performed (step S106). In the unloading process, the wafer W held by the substrate holder 102 is delivered to an external substrate transport apparatus. When the unloading process is completed, substrate processing for one wafer W is completed.

Second Embodiment

Figure 8:
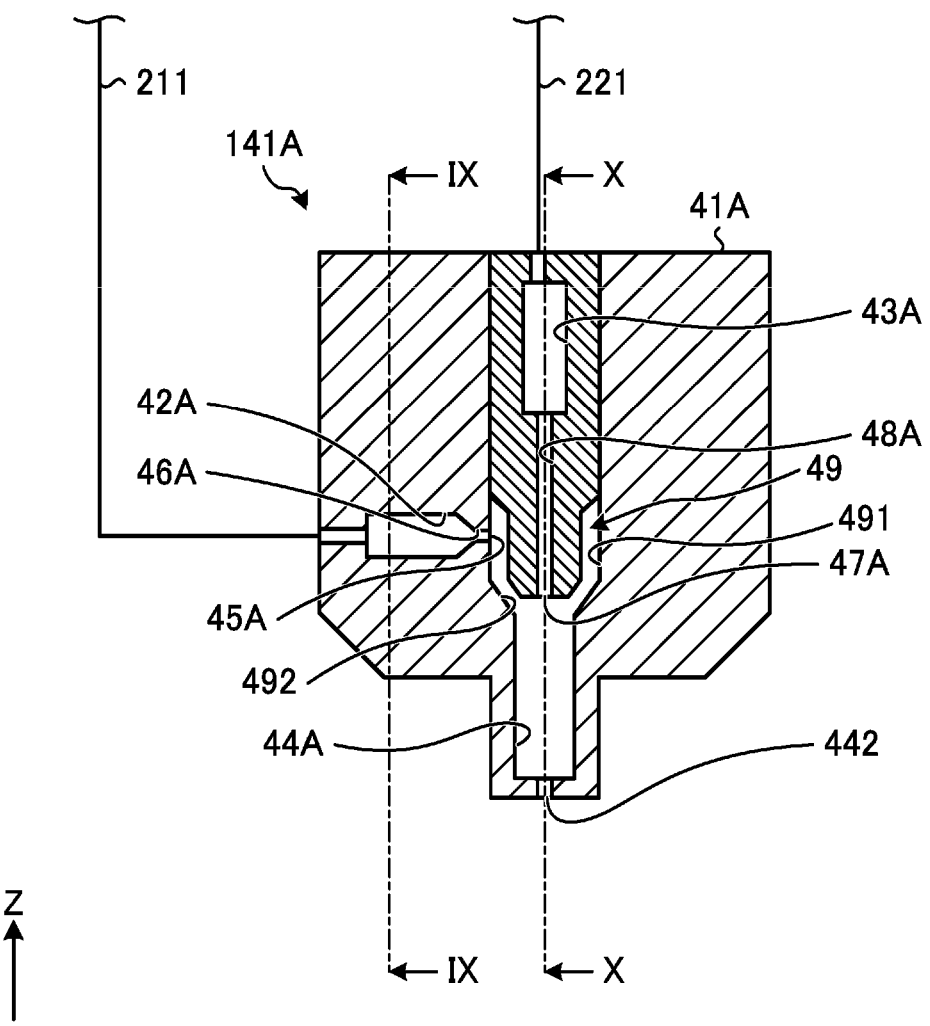
FIG. 8 is a cross-sectional view of a nozzle according to a second embodiment of the present disclosure taken along a plane orthogonal to a longitudinal direction of the nozzle.
Figure 9:
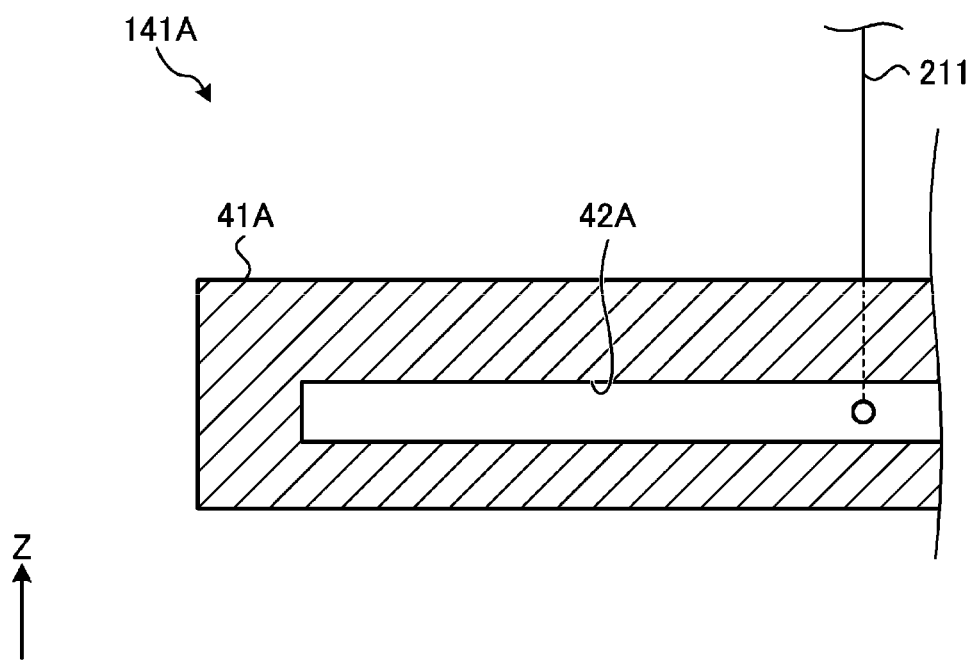
FIG. 9 is a cross-sectional view taken along line IX-IX indicated in FIG. 8.
Figure 10:
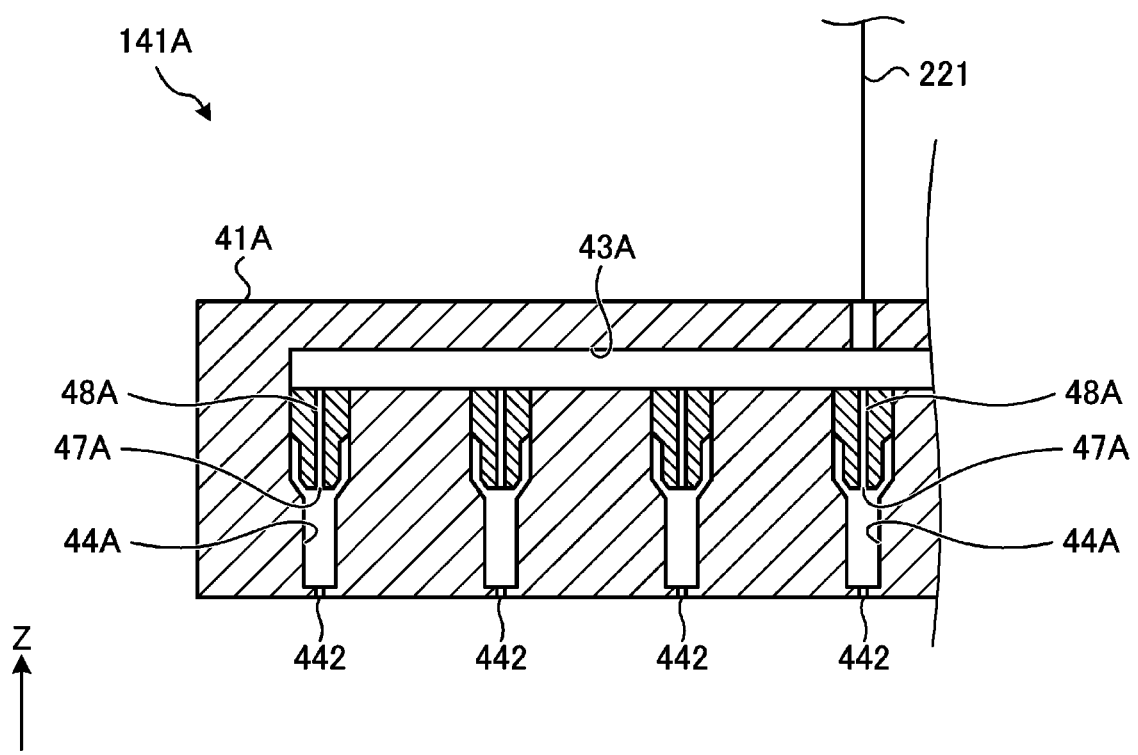
FIG. 10 is a cross-sectional view taken along line X-X indicated in FIG. 8.
Figure 11:
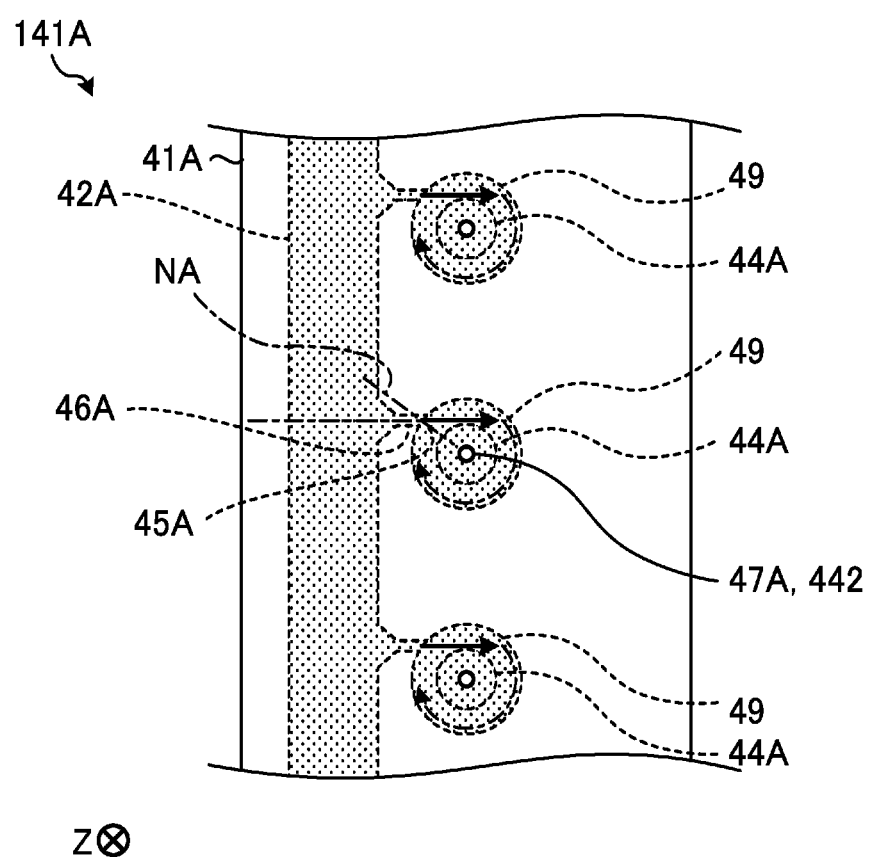
FIG. 11 is a schematic plan view of the nozzle according to the second embodiment when viewed from below.

Next, a structure of a nozzle according to a second embodiment of the present disclosure will be described with reference to FIGS. 8 to 11. FIG. 8 is a cross-sectional view of a nozzle according to the second embodiment taken along a plane orthogonal to the longitudinal direction of the nozzle. FIG. 9 is a cross-sectional view taken along line IX-IX indicated in FIG. 8. FIG. 10 is a cross-sectional view taken along line X-X indicated in FIG. 8. FIG. 11 is a schematic plan view of the nozzle according to the second embodiment when viewed from below. Further, in FIG. 11, the area through which the vapor flows is indicated by dots.

As illustrated in FIG. 8, the nozzle 141A according to the second embodiment is a so-called internal mixing type two-fluid nozzle. The nozzle 141A includes an elongated nozzle main body 41A, a first distribution path 42A (see FIG. 9), a second distribution path 43A (see FIG. 10), and lead-out paths 44A (see FIG. 10). Further, the nozzle 141A includes first ejection ports 45A and first supply paths 46A (see FIG. 9), and second ejection ports 47A and second supply paths 48A (see FIG. 10).

The first distribution path 42A and the second distribution path 43A are formed inside the nozzle main body 41A. As illustrated in FIGS. 9 and 10, the first distribution path 42A and the second distribution path 43A extend along the longitudinal direction of the nozzle main body 41. The first distribution path 42A is connected to the vapor supplier 201 via the vapor supply path 211. The first distribution path 42A distributes vapor, which is supplied from the vapor supplier 201, to first supply paths 46A. Further, the second distribution path 43A is connected to the SPM supplier 202 via the SPM supply path 221. The second distribution path 43A distributes the SPM liquid, which is supplied from the SPM supplier 202, to the second supply paths 48A.

The second supply path 48A supplies the SPM liquid, which is distributed from the second distribution path 43A, to a second ejection port 47A, which is an outlet. As illustrated in FIG. 8, a second supply paths 48A and a lead-out path 44A extend vertically and are coaxially arranged.

The second ejection port 47A, which is the outlet of the second supply path 48A, is arranged close to the inlet of the lead-out path 44A. The cross-sectional area of the second supply path 48A may be constant from the inlet to the outlet, and a cross-sectional shape of the second supply path 48A may be circular, elliptical, or the like. As illustrated, when the cross-sectional area of the second supply path 48A is constant from the inlet to the outlet, the cross-sectional area (diameter) of the second ejection port 47A, which is the outlet of the second supply path 48A, is equal to the cross-sectional area (diameter) of the second supply path 48A.

An annular lead-in space 49 is formed around the second supply path 48A to surround the second supply path 48A.

A first supply path 46A supplies the vapor, which is distributed from the first distribution path 42A, to a first ejection port 45A, which is an outlet. Specifically, the first ejection port 45A, which is the outlet of the first supply path 46A, is connected to the lead-in space 49 to supply the vapor to the lead-in space 49.

The second supply path 48A is arranged to pass through the interior of the lead-in space 49. This lead-in space 49 is formed in a tubular shape having an annular cross-sectional shape. The lead-in space 49 is provided with an annular portion 491 and a tapered portion 492 having a diameter decreasing downward. The tapered portion 492 is disposed at the downstream side of the annular portion 491, and an outlet of the tapered portion 492 is open annularly between the outlet of the second supply path 48A and the inlet of the lead-out path 44A. Therefore, the vapor led into the lead-in space 49 is mixed with the SPM liquid ejected from the second ejection port 47A, which is the outlet of the second supply path 48A, near the inlet of the lead-out path 44A, whereby a mixed fluid of the SPM liquid (droplets of the SPM liquid) is formed.

The first ejection port 45A, which is the outlet of the first supply path 46A, is disposed above the second ejection port 47A, which is the outlet of the second supply path 48A, and is open at the inner wall surface of the annular portion 491 in the lead-in space 49. The cross-sectional area of the first supply path 46A may be constant from the inlet to the outlet, and the cross-sectional shape of the first supply path 46A may be, for example, circular, elliptical, or the like. As illustrated, when the cross-sectional area of the first supply path 46A is constant from the inlet to the outlet, the cross-sectional area (diameter) of the first ejection port 45A, which is the outlet of the first supply path 46A, is equal to the cross-sectional area (diameter) of the first supply path 46A.

The lead-out path 44A is arranged coaxially with the second supply path 48A as described above, and is in fluid communication with the second supply path 48A and the lead-in space 49. The lead-out path 44A may be formed linearly, and the cross-sectional area (diameter) of the lead-out path 44A may be constant from the inlet to the outlet. The cross-sectional shape of the lead-out path 44a may be, for example, circular, elliptical, or the like.

The vapor led in from the first supply path 46A through the lead-in space 49 and the SPM liquid led in from the second supply path 48A are mixed near the inlet of the lead-out path 44A. As a result, an infinite number of droplets of the SPM liquid are formed, and the formed droplets are led out to the exterior via the lead-out path 44A together with the vapor.

A injection ports 442 are formed at the tip of the lead-out path 44A. Each injection port 442 is formed in an orifice shape with a smaller cross-sectional area than the lead-out path 44A. In the absence of the orifice-shaped injection port 442 having the cross-sectional area smaller than that of the lead-out path 44A, droplets grown along the inner wall of the lead-out path 44A are ejected as they are. The cross-sectional area of the injection port 442 may be constant from the inlet to the outlet, and the cross-sectional shape of the injection port 442 may be, for example, circular, elliptical, or the like. The droplets that have passed through the interior of the lead-out path 44A are atomized again while passing through the interior of the injection port 442 and are injected. Therefore, even when the droplets grow large while moving along the inner wall of the lead-out path 44A, the droplets are capable of being atomized to a sufficiently small particle size by causing the droplets to pass through the injection port 442 and then injected.

As illustrated in FIGS. 8 to 11, the nozzle 141A according to the second embodiment includes first ejection ports 45A and second ejection ports 47A, and includes lead-out paths 44A, each of which is in fluid communication with one first ejection port 45A and one second ejection port 47A. Further, the numbers of first ejection ports 45A and second ejection ports 47A being in fluid communication with one lead-out path 44A are not limited to the numbers illustrated in FIGS. 8 to 11. That is, the nozzle 141A may include lead-out paths 44 being in fluid communication with at least one first ejection port 45A and at least one second ejection port 47A.

Further, as illustrated in FIG. 11, each second ejection port 47A is arranged coaxially with a lead-out path 44 and an injection port 442 in a plan view. The second ejection ports 47A eject the SPM liquid in the direction along the center axes of the lead-out paths 44A (that is, the Z-axis direction). Further, the first ejection ports 45A are arranged to be directed to positions deviated from the central axes of the lead-out paths 44A in a plan view. The first ejection ports 45A eject vapor toward the positions deviated from the central axes of the lead-out paths 44A in a plan view. As a result, the vapor ejected from the first ejection ports 45A and colliding with the inner wall surfaces of the lead-in spaces 49 is mixed with the SPM liquid ejected from the second ejection ports 47A while forming swirling flows of vapor in the lead-out paths 44A in the process of flowing through the lead-out paths 44A and reaching the injection ports 442. The vapor ejected from the first ejection ports 45A flows along the inner wall surfaces of the lead-in spaces 49 to form the swirling flows of vapor in the lead-out paths 44A.

When the first ejection ports 45A are arranged to be directed to the positions of the center axes of the lead-out paths 44A in a plan view, the vapor ejected from the first ejection ports 45A collide with the inner wall surfaces of the lead-in spaces 49 and is distributed. Thus, swirling flows of vapor are unlikely to be formed in the lead-out paths 44A.

In contrast, in the nozzle 141A according to the second embodiment, by arranging the first ejection ports 45A to be directed to the positions deviated from the central axes of the lead-out paths 44A in a plan view, it is possible to cause the vapor ejected from the first ejection ports 45A to flow along the inner wall surfaces of the lead-in spaces 49. Thus, the nozzle 141 may easily form swirling flows of vapor in the lead-out paths 44A being in fluid communication with the lead-in spaces 49. Therefore, with the nozzle 141A according to the second embodiment, it is possible to efficiently mix the vapor and the SPM liquid compared to the case where the first ejection ports 45A are arranged to be directed to the positions of the central axes of the lead-out paths 44A. Further, by efficiently mixing the vapor and the SPM liquid, it is possible to efficiently raise the temperature of the SPM liquid.

The central axes of the first ejection ports 45A are tilted respectively with respect to the directions of the normal lines NA of the inner surfaces of the lead-out paths 44A in a plan view. By tilting the central axes of the first ejection ports 45A with respect to the directions of the normal lines NA, it is possible to facilitate the formation of swirling flows of vapor in the lead-out paths 44A compared to the case where the central axes of the first ejection ports 45A are perpendicular to the inner surfaces of the lead-out paths 44A. Further, since the swirling flows may extend the staying time of the vapor in the lead-out paths 44A, it is possible to suppress the amount of vapor used when mixing the vapor and the SPM liquid.

<Modifications>

Figure 12:
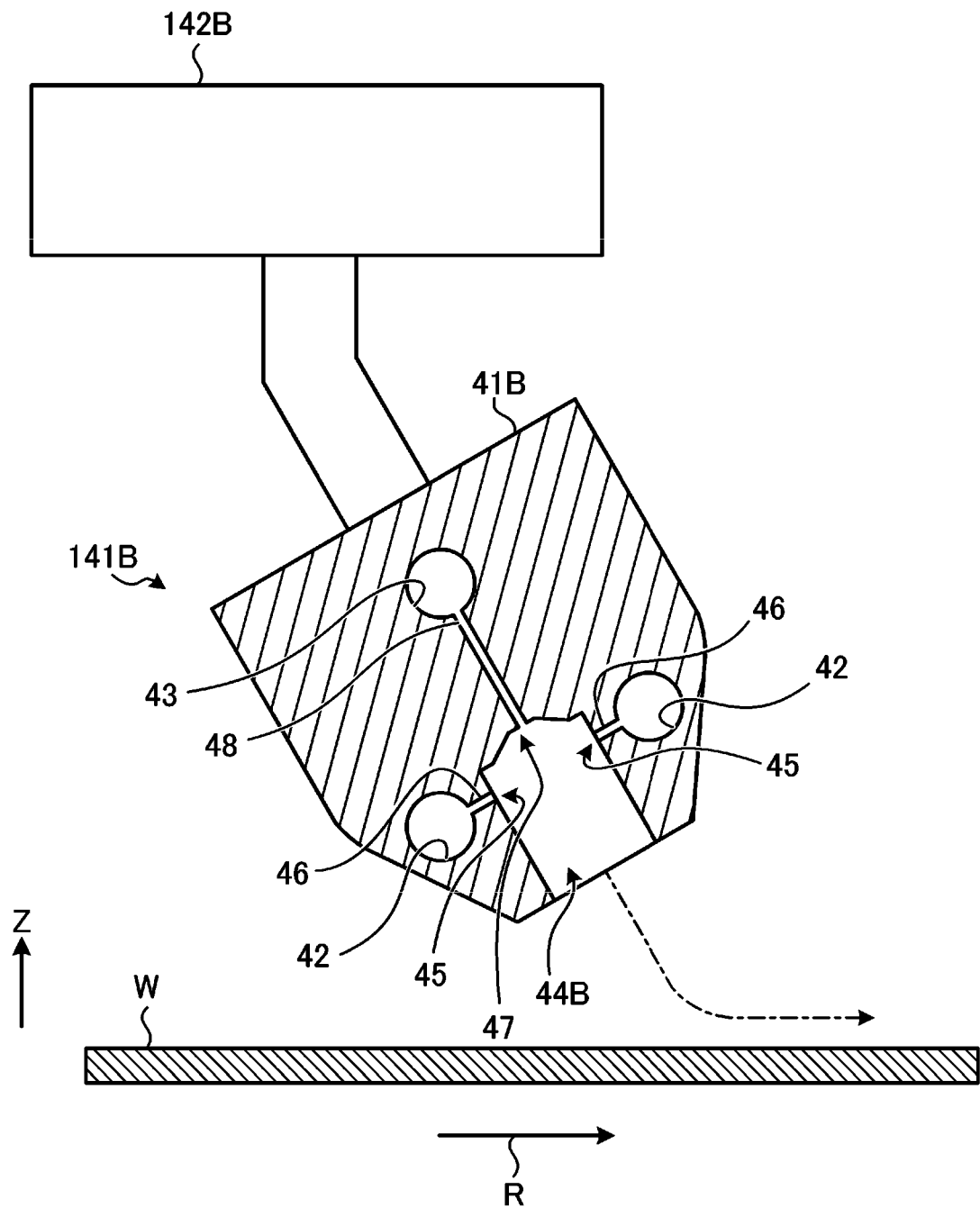
FIG. 12 is a cross-sectional view of a nozzle according to a first modification of the first embodiment taken along a plane orthogonal to a longitudinal direction of the nozzle.

FIG. 12 is a cross-sectional view of a nozzle according to a first modification of the first embodiment of the present disclosure taken along a plane orthogonal to a longitudinal direction of the nozzle. FIG. 12 illustrates a state in which the nozzle 141B according to the first modification of the first embodiment is located at the processing position above a wafer W.

As illustrated in FIG. 12, the nozzle main body 41B of the nozzle 141B includes a lead-out path 44B. The lead-out path 44B is arranged obliquely with respect to the rotation direction R of the wafer W rotated by the substrate holder 102. That is, by supporting the nozzle 141B from above by a first arm 142B in a state in which the nozzle 141B is tilted with respect to the vertical axis (Z-axis), the lead-out path 44B is arranged obliquely with respect to the rotation direction R of the wafer W. By arranging the lead-out path 44B obliquely in this way, it is possible to release the vapor ejected from the lead-out path 44B along the front surface of the wafer W in the rotation direction of the wafer W, and therefore it is possible to suppress fume from staying in the vicinity of the front surface of the wafer W. The lead-out path 44A in the nozzle 141A according to the second embodiment may also be arranged obliquely with respect to the rotation direction R of the wafer W.

Figure 13:
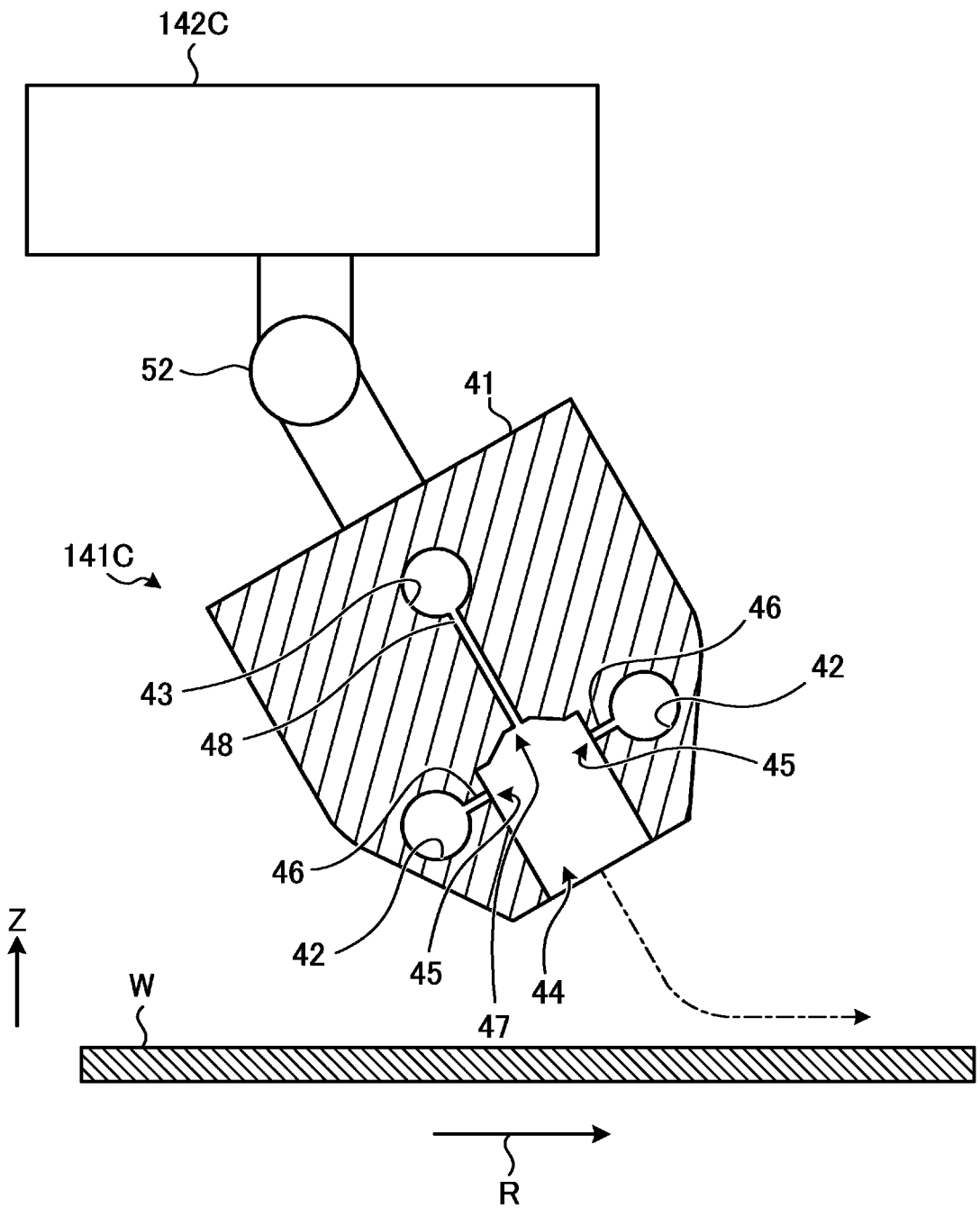
FIG. 13 is a cross-sectional view of a nozzle according to a second modification of the first embodiment taken along a plane orthogonal to a longitudinal direction of the nozzle.

FIG. 13 is a cross-sectional view of a nozzle according to a second modification of the first embodiment taken along a plane orthogonal to the longitudinal direction of the nozzle. In FIG. 13, the nozzle 141C according to the second modification of the first embodiment is supported from above by a first arm 142C to be tiltable with respect to the vertical axis (the Z-axis). That is, the first arm 142C includes an inclination regulation mechanism 52 that regulates the inclination of the nozzle 141C, and the inclination regulation mechanism 52 allows the nozzle 141C to be tilted with respect to the vertical axis (the Z-axis).

Figure 14:
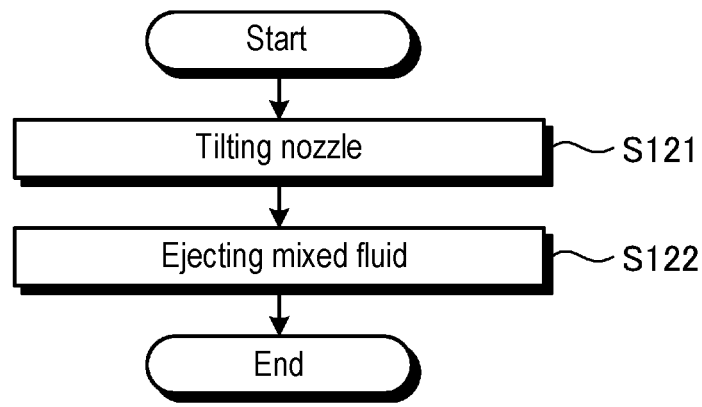
FIG. 14 is a flowchart illustrating a procedure of a SPM process according to the second modification of the first embodiment.

Next, an SPM process in which the nozzle 141C is used will be described with reference to FIG. 14. FIG. 14 is a flowchart illustrating a procedure of the SPM process according to the second modification of the first embodiment. The SPM process illustrated in FIG. 14 is executed under the control of a controller 301 (see FIG. 1). Further, the SPM process illustrated in FIG. 14 is executed in the state in which a wafer W held by the substrate holder 102 is rotated.

First, a first pivot/lift mechanism 143 moves the nozzle 141C from the standby position to the processing position on the wafer W. Subsequently, the controller 301 tilts the nozzle 141C with respect to the vertical axis (the Z-axis) by the inclination regulation mechanism 52 of the first arm 142C, and arranges the lead-out path 44 obliquely with respect to the rotation direction R of the wafer W (see FIG. 13) (step S121).

Thereafter, a mixed fluid of vapor and an SPM liquid is ejected from the nozzle 141C to the front surface of the wafer W (step S122). As a result, the resist film formed on the front surface of the wafer W is removed. In this case, the lead-out path 44 is obliquely arranged with respect to the rotation direction R of the wafer W. As a result, by arranging the lead-out path 44 obliquely in this way, it is possible to release the vapor ejected from the lead-out path 44 along the front surface of the wafer W in the rotation direction of the wafer W, and therefore it is possible to suppress fume from staying in the vicinity of the front surface of the wafer W. The nozzle 141A according to the second embodiment may be supported from above by the first arm 142C to be tiltable with respect to the vertical axis (Z-axis). In this case, an SPM process similar to the SPM process illustrated in FIG. 14 may be executed under the control of the controller 301.

Figure 15:
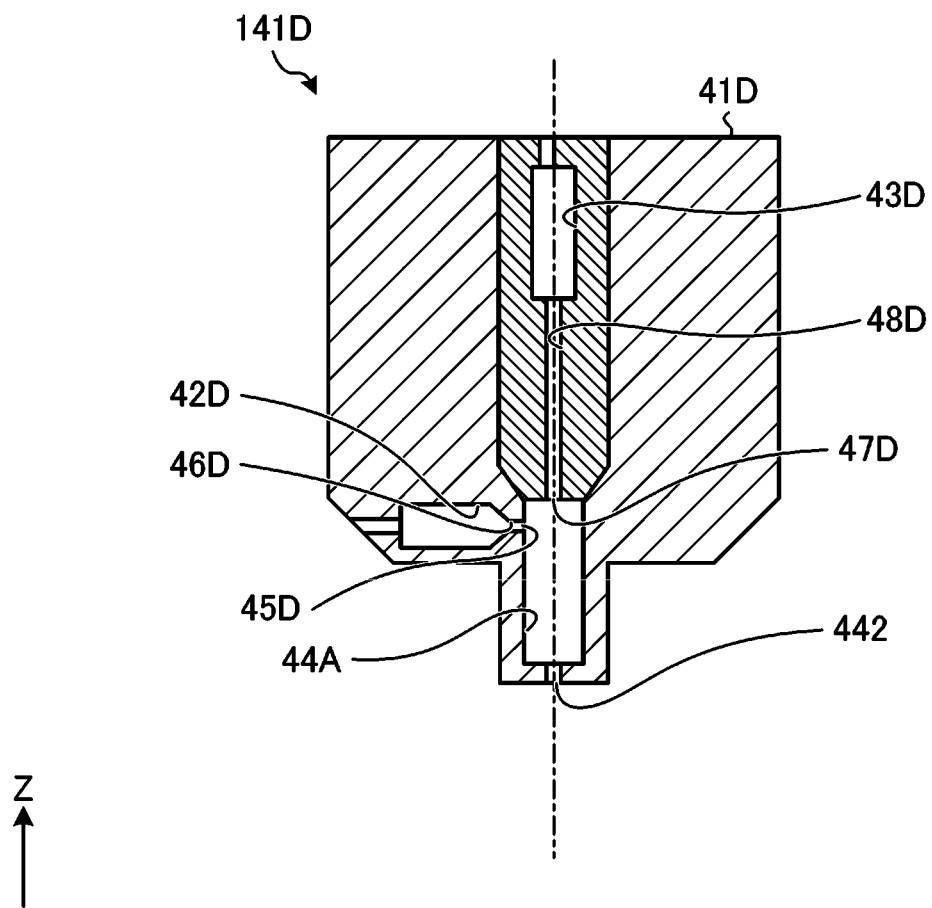
FIG. 15 is a cross-sectional view of a nozzle according to a first modification of the second embodiment taken along a plane orthogonal to a longitudinal direction of the nozzle.

FIG. 15 is a cross-sectional view of the nozzle according to a first modification of the second embodiment taken along a plane orthogonal to a longitudinal direction of the nozzle. As illustrated in FIG. 15, a nozzle main body 41D of the nozzle 141D according to the first modification of the second embodiment includes a first distribution path 42D and a second distribution path 43D. Further, the nozzle main body 41D includes first ejection ports 45D and first supply paths 46D, second ejection ports 47D, and second supply paths 48D.

A lead-in space 49 is formed around the second supply path 48A of the nozzle 141A according to the second embodiment of the present disclosure described above, but no lead-in space 49 is formed around the second supply path 48D in the first modification of the second embodiment. A second ejection port 47D, which is the outlet of the second supply path 48D, is in a direct fluid communication with the inlet of a lead-out path 44A.

Further, a first ejection port 45D, which is an outlet of a first supply path 46D, is open at the inner surface of a lead-out path 44A and supplies vapor to the lead-out path 44D.

The vapor led in from the first supply path 46D and the SPM liquid led in from the second supply path 48D are mixed near the upper end, which is the inlet of the lead-out path 44A. As a result, an infinite number of droplets of the SPM liquid are formed, and the formed droplets are led out to the outside via the lead-out path 44A together with the vapor.

In this way, the second supply path 48D and the second ejection port 47D may be in a direct fluid communication with the lead-out path 44A without going through the lead-in space 49. Further, the first ejection port 45D may open at the inner surface of the lead-out path 44A. As a result, even with a simple structure in which the lead-in spaces 49 are not formed, it is possible to efficiently mix the vapor and the SPM liquid.

[Other Modifications]

In each of the above-described embodiments and modifications, examples of mixing the vapor and the SPM liquid have been described, but mist may be used instead of the vapor. That is, instead of the vapor supplier 201, a mist supplier configured to supply mist of pressurized pure water may be provided.

In each of the above-described embodiments and modifications, the substrate processing apparatus configured to remove the resist film formed on the front surface of the substrate has been described as an example. That is, an example in which the object to be removed in the SPM process is the resist film has been described. However, the object to be removed in the SPM process is not limited to the resist film. For example, an object to be removed in an SPM process may be residue (organic matter) after ashing. Further, the object to be removed in the SPM process may be residual substances contained in abrasives after chemical mechanical polishing (CMP).

In the first embodiment of the present disclosure described above, the position of the first ejection port 45 and the position of the second ejection port 47 may be opposite to each other. That is, the vapor or mist may be ejected from the position of the second ejection port 47 illustrated in FIG. 3, and the SPM liquid may be ejected from the position of the first ejection port 45. Further, in the second embodiment, the position of the first ejection port 45A and the position of the second ejection port 47A may be opposite to each other. That is, the vapor or mist may be ejected from the position of the second ejection port 47A illustrated in FIG. 8, and the SPM liquid may be ejected from the position of the first ejection port 45A.

As described above, the nozzle according to the embodiments (for example, the nozzle 141, and 141A to 141D) are nozzles that mix a fluid containing steam or mist of pressurized pure water (for example, vapor or mist) and a processing liquid containing at least sulfuric acid (for example, SPM liquid) and eject the mixed liquid. The nozzle includes a first ejection port (for example, the first ejection port 45, 45A, or 45D), a second ejection port (for example, the second ejection port 47, 47A, or 47D), and a lead-out path (for example, the lead-out path 44, 44A, or 44B). The first ejection port ejects a fluid. The second ejection port ejects a processing liquid. The lead-out path is in fluid communication with the first ejection port and the second ejection port, and leads out a mixed fluid of the fluid ejected from the first ejection port and the processing liquid ejected from the second ejection port. Further, the first ejection port or the second ejection port is arranged to be directed to a position deviated from the central axis of the lead-out path in a plan view.

With the nozzle according to the embodiments of the present disclosure, it is possible to cause the vapor ejected from the first ejection port to flow along the inner surface of the lead-out path. This makes it easy to form a swirling flow of vapor in the lead-out path. Therefore, with the nozzle according to the embodiments of the present disclosure, it is possible to efficiently mix the vapor and the SPM liquid in the SPM process in which the mixed fluid of the vapor and the SPM liquid is used. As a result, with the nozzle according to the embodiments of the present disclosure, it is possible to efficiently raise the temperature of the SPM liquid, and therefore a removal efficiency of the object to be removed may be improved in the SPM process in which the mixed fluid of the vapor and the SPM liquid is used.

The central axis of the first ejection port or the second ejection port may be tilted with respect to the direction of the normal line (for example, the normal line N or NA) of the inner surface of the lead-out path in a plan view. This makes it easy to form a swirling flow of vapor in the lead-out path. Further, since the swirling flow may extend the staying time of the vapor in the lead-out path, it is possible to suppress the amount of vapor used when mixing the vapor and the SPM liquid.

A nozzle according to the embodiments of the present disclosure may include first ejection ports and second ejection ports, and may include lead-out paths, each of which is in fluid communication with at least one first ejection port and at least one second ejection port.

Each first ejection port (for example, the first ejection port 45) may be open at the inner surface of the lead-out path (for example, the lead-out path 44 or 44B). Further, each second ejection port (for example, the second ejection port 47) may be open at the upper end surface of the lead-out path. This makes it possible to efficiently mix the vapor and the SPM liquid in the vicinity of the upper end, which is the inlet of the lead-out path.

A nozzle according to the embodiments (for example, the nozzle 141A) may further include a second supply path (for example, the second supply path 48A) and a lead-in space (for example, the lead-in space 49). The second supply path may supply processing liquid to the second ejection port. The lead-in space is formed in an annular shape surrounding the second supply path. Further, the second ejection port and the second supply path may be arranged coaxially with a lead-out path (for example, the lead-out path 44A) and be in fluid communication with the lead-out path and the lead-in space. Further, the first ejection port (for example, the first ejection port 45A) may be open at the inner wall surface of the lead-in space.

With the nozzle according to the embodiments, it is possible to cause the vapor ejected from the first ejection port to flow along the inner wall surface of the lead-in space. This makes it easy to form the swirling flow of vapor in the lead-out path being in fluid communication with the lead-in space. Therefore, with the nozzle according to the embodiments of the present disclosure, it is possible to efficiently mix the vapor and the SPM liquid in the SPM process in which the mixed fluid of the vapor and the SPM liquid is used. As a result, with the nozzle according to the embodiments of the present disclosure, it is possible to efficiently raise the temperature of the SPM liquid, and therefore the removal efficiency of the object to be removed may be improved in the SPM process in which the mixed fluid of the vapor and the SPM liquid is used.

The first ejection port (for example, the first ejection port 45A) may be arranged above the second ejection port (for example, the second ejection port 47A), and may eject the fluid toward the position deviated from the central axis of the lead-out path (for example, the lead-out path 44A) in a plan view, thereby forming the swirling flow that swirls in the lead-out path. This makes it possible to efficiently mix the vapor and the SPM liquid in the SPM process in which the mixed fluid of the vapor and the SPM liquid is used.

The first ejection port may be open at the upper end surface of the lead-out path. Further, the second ejection port may be open at the inner surface of the lead-out path.

A nozzle according to embodiments of the present disclosure may further include a first supply path and a lead-in space. The first supply path may supply the fluid to the first ejection port. The lead-in space may be formed in an annular shape surrounding the first supply path. Further, the first ejection port and the first supply path may be arranged coaxially with the lead-out path and may be in fluid communication with the lead-out path and the lead-in space. The second ejection port may be open at the inner wall surface of the lead-in space.

The second ejection port may be arranged above the first ejection port, and may eject the processing liquid toward the position deviated from the central axis of the lead-out path in a plan view, thereby forming the swirling flow that swirls in the lead-out path.

A substrate processing apparatus according to the embodiments (for example, the substrate processing apparatus 1) includes a substrate holder (for example, the substrate holder 102), a fluid supplier (for example, the vapor supplier 201), a processing liquid supplier (for example, the SPM supplier 202), and a nozzle (for example, the nozzle 141, and 141A to 141D). The substrate holder rotatably holds a substrate (for example, a wafer W). The fluid supplier supplies a fluid containing steam or mist of pressurized pure water (for example, vapor or mist). The processing liquid supplier supplies a processing liquid containing at least sulfuric acid (for example, SPM liquid). The nozzle is connected to the fluid supplier and the processing liquid supplier, mixes the fluid and the processing liquid, and ejects the mixed liquid to the substrate. Further, the nozzle includes a first ejection port (for example, the first ejection port 45, 45A, or 45D), a second ejection port (for example, the second ejection port 47, 47A, or 47D), and a lead-out path (for example, the lead-out path 44, 44A, or 44B). The first ejection port ejects a fluid. The second ejection port ejects a processing liquid. The lead-out path is in fluid communication with the first ejection port and the second ejection port, and leads out the mixed fluid of the fluid ejected from the first ejection port and the processing liquid ejected from the second ejection port. Further, the first ejection port or the second ejection port is arranged to be directed to a position deviated from the central axis of the lead-out path in a plan view.

With the substrate processing apparatus according to the embodiments of the present disclosure, it is possible to cause the vapor ejected from the first ejection port to flow along the inner surface of the lead-out path. This makes it easy to form the swirling flow of vapor in the lead-out path. Therefore, with the substrate processing apparatus according to the embodiments, it is possible to efficiently mix the vapor and the SPM liquid in the SPM process in which the mixed fluid of the vapor and the SPM liquid is used. As a result, with the substrate processing apparatus according to the embodiments of the present disclosure, it is possible to efficiently raise the temperature of the SPM liquid, and therefore the removal efficiency of the object to be removed may be improved in the SPM process in which the mixed fluid of the vapor and the SPM liquid is used.

The lead-out path may be arranged obliquely with respect to the rotation direction (for example, the rotation direction R) of the substrate rotated by the substrate holder. This makes it possible to release the vapor ejected from the lead-out path along the front surface of the substrate in the rotation direction of the substrate, thereby suppressing fume from staying in the vicinity of the front surface of the substrate.

A substrate processing apparatus according to the embodiments (for example, the substrate processing apparatus 1) includes a substrate holder (for example, the substrate holder 102), a fluid supplier (for example, the vapor supplier 201), a processing liquid supplier (for example, the SPM supplier 202), a nozzle (for example, the nozzle 141, and 141A to 141D), and a controller (for example, the controller 301). The substrate holder rotatably holds the substrate (for example, the wafer W). The fluid supplier supplies the fluid containing steam or mist of pressurized pure water (for example, vapor or mist). The processing liquid supplier supplies the processing liquid containing at least sulfuric acid (for example, SPM liquid). The nozzle is connected to the fluid supplier and the processing liquid supplier, mixes the fluid and the processing liquid, and ejects the mixed liquid to the substrate. Further, the nozzle includes a first ejection port (for example, the first ejection port 45, 45A, or 45D), a second ejection port (for example, the second ejection port 47, 47A, or 47D), and a lead-out path (for example, the lead-out path 44, 44A, or 44B). The first ejection port ejects the fluid. The second ejection port ejects the processing liquid. The lead-out path is in fluid communication with the first ejection port and the second ejection port, and leads out the mixed fluid of the fluid ejected from the first ejection port and the processing liquid ejected from the second ejection port. Further, the first ejection port or the second ejection port is arranged to be directed to the position deviated from the central axis of the lead-out path in a plan view. Further, the controller tilts the nozzle in the state in which the substrate held by the substrate holder is rotated, arranges the lead-out path obliquely with respect to the rotation direction of the substrate (for example, the rotation direction R), and ejects the mixed fluid from the nozzle toward the substrate. This makes it possible to release the vapor ejected from the lead-out path along the front surface of the substrate in the rotation direction of the substrate, thereby suppressing fume from staying in the vicinity of the front surface of the substrate.

According to the present disclosure, it is possible to efficiently mix a fluid and a processing liquid in a liquid process in which a mixed fluid of the fluid and the processing liquid is used.

The embodiments disclosed herein should be considered to be exemplary in all respects and not restrictive. Indeed, the above-described embodiments may be implemented in various forms. The embodiments described above may be omitted, replaced, or modified in various forms without departing from the scope and spirit of the appended claims.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A nozzle that mixes a fluid containing steam or mist of pressurized pure water and a processing liquid containing at least sulfuric acid and ejects a mixed fluid of the fluid and the processing liquid, the nozzle comprising:
    at least one first ejection port configured to eject the fluid;
    at least one second ejection port configured to eject the processing liquid; and
    at least one lead-out path extending vertically downward to form an inner wall surface, configured to be in fluid communication with the at least one first ejection port and the at least one second ejection port, and configured to lead out the mixed fluid of the fluid ejected from the at least one first ejection port and the processing liquid ejected from the at least one second ejection port,
    wherein the at least one first ejection port or the at least one second ejection port is arranged to be directed to a position deviated from a central axis of the at least one lead-out path in a plan view.

2. The nozzle of claim 1, wherein a central axis of the at least one first ejection port or the at least one second ejection port is tilted with respect to a direction of a normal line of an inner wall surface of the at least one lead-out path in the plan view.

3. The nozzle of claim 2, wherein the at least one first ejection port includes a plurality of first ejection ports, the at least one second ejection port includes a plurality of second ejection ports, and the at least one lead-out path includes a plurality of lead-out paths, and
    wherein the nozzle comprises the plurality of first ejection ports, the plurality of second ejection ports, and the plurality of lead-out paths, each of which is configured to be in fluid communication with the at least one first ejection port and the at least one second ejection port.

4. The nozzle of claim 3, wherein the first ejection ports are open at inner wall surfaces of the lead-out paths, and
    wherein the second ejection ports are open to upper end surfaces of the lead-out paths.

5. The nozzle of claim 1, wherein the at least one first ejection port includes a plurality of first ejection ports, the at least one second ejection port includes a plurality of second ejection ports, and the at least one lead-out path includes a plurality of lead-out paths, and
    wherein the nozzle comprises the plurality of first ejection ports, the plurality of second ejection ports, and the plurality of lead-out paths, each of which is configured to be in fluid communication with the at least one first ejection port and the at least one second ejection port.

6. The nozzle of claim 1, wherein the at least one first ejection port is open at an inner wall surface of the at least one lead-out path, and
    wherein the at least one second ejection port is open to an upper end surface of the at least one lead-out path.

7. The nozzle of claim 1, further comprising:
    a second supply path configured to supply the processing liquid to the at least one second ejection port; and
    a lead-in space formed in an annular shape surrounding the second supply path,
    wherein the at least one second ejection port and the second supply path are arranged coaxially with the at least one lead-out path, and are configured to be in fluid communication with the at least one lead-out path and the lead-in space, and
    wherein the at least one first ejection port is open to an inner wall surface of the lead-in space.

8. The nozzle of claim 7, wherein the at least one first ejection port is arranged above the at least one second ejection port, and is configured to eject the fluid toward the position deviated from the central axis of the at least one lead-out path in the plan view to form a swirling flow that swirls in the at least one lead-out path.

9. The nozzle of claim 1, wherein the at least one first ejection port is open to an upper end surface of the at least one lead-out path, and
    wherein the at least one second ejection port is open to an inner wall surface of the at least one lead-out path.

10. The nozzle of claim 1, further comprising:
    a first supply path configured to supply the fluid to the at least one first ejection port; and
    a lead-in space formed in an annular shape surrounding the first supply path,
    wherein the at least one first ejection port and the first supply path are arranged coaxially with the at least one lead-out path, and are configured to be in fluid communication with the at least one lead-out path and the lead-in space, and
    wherein the at least one second ejection port is open to an inner wall surface of the lead-in space.

11. The nozzle of claim 10, wherein the at least one second ejection port is arranged above the at least one first ejection port, and is configured to eject the processing liquid toward the position deviated from the central axis of the at least one lead-out path in the plan view to form a swirling flow that swirls in the at least one lead-out path.

12. A substrate processing apparatus comprising:
    a substrate holder configured to rotatably hold a substrate;
    a fluid supplier configured to supply the fluid containing steam or mist of pressurized pure water;
    a processing liquid supplier configured to supply the processing liquid containing at least sulfuric acid; and
    the nozzle of claim 1 connected to the fluid supplier and the processing liquid supplier and configured to mix the fluid and the processing liquid and eject the mixed fluid to the substrate.

13. The substrate processing apparatus of claim 12, wherein the at least one lead-out path is arranged obliquely with respect to a rotation direction of the substrate rotated by the substrate holder.

14. A substrate processing apparatus comprising:
a substrate holder configured to rotatably hold a substrate;
a fluid supplier configured to supply a fluid containing steam or mist of pressurized pure water;
a processing liquid supplier configured to supply a processing liquid containing at least sulfuric acid;
a nozzle connected to the fluid supplier and the processing liquid supplier and configured to mix the fluid and the processing liquid and eject a mixed fluid of the fluid and the processing liquid to the substrate; and
a controller configured to control the substrate holder, the fluid supplier, the processing liquid supplier, and the nozzle,
wherein the nozzle includes:
a first ejection port configured to eject the fluid;
a second ejection port configured to eject the processing liquid; and
a lead-out path extending vertically downward to form an inner wall surface, configured to be in fluid communication with the first ejection port and the second ejection port, and configured to lead out the mixed fluid of the fluid ejected from the first ejection port and the processing liquid ejected from the second ejection port,
wherein the first ejection port or the second ejection port is arranged to be directed to a position deviated from a central axis of the lead-out path in a plan view,
wherein the controller is configured to tilt the nozzle in a state in which the substrate held on the substrate holder is rotated such that the lead-out path is arranged obliquely with respect to a rotation direction of the substrate, and
wherein the controller is configured to eject the mixed fluid from the nozzle toward the substrate.

15. A substrate processing method in a substrate processing apparatus,
wherein the substrate processing apparatus comprises:
a substrate holder configured to rotatably hold a substrate;
a fluid supplier configured to supply a fluid containing steam or mist of pressurized pure water;
a processing liquid supplier configured to supply a processing liquid containing at least sulfuric acid; and
a nozzle connected to the fluid supplier and the processing liquid supplier and configured to mix the fluid and the processing liquid and eject a mixed fluid of the fluid and the processing liquid to the substrate,
wherein the nozzle includes:
a first ejection port configured to eject the fluid;
a second ejection port configured to eject the processing liquid; and
a lead-out path extending vertically downward to form an inner wall surface, configured to be in fluid communication with the first ejection port and the second ejection port, and configured to lead out the mixed fluid of the fluid ejected from the first ejection port and the processing liquid ejected from the second ejection port,
wherein the first ejection port or the second ejection port is arranged to be directed to a position deviated from a central axis of the lead-out path in a plan view, and
wherein the substrate processing method comprises:
tilting the nozzle in a state in which the substrate held on the substrate holder is rotated such that the lead-out path is arranged obliquely with respect to a rotation direction of the substrate; and
ejecting the mixed fluid from the nozzle toward the substrate.

* * * * *